(12) United States Patent
Dorning

(10) Patent No.: US 7,308,243 B2
(45) Date of Patent: Dec. 11, 2007

(54) MIXER ARRANGEMENT AND METHOD FOR MIXING SIGNALS

(75) Inventor: Philip Dorning, Wiltshire (GB)

(73) Assignee: Nokia Corporation, Espoo (FI)

( * ) Notice: Subject to any disclaimer, the term of this patent is extended or adjusted under 35 U.S.C. 154(b) by 399 days.

(21) Appl. No.: 10/633,696

(22) Filed: Aug. 5, 2003

(65) Prior Publication Data

US 2004/0209589 A1    Oct. 21, 2004

(51) Int. Cl.
H04B 1/26    (2006.01)

(52) U.S. Cl. .................. 455/323; 455/313; 455/302; 455/314

(58) Field of Classification Search ............... 455/323, 455/313, 324, 314–322, 310, 311, 302
See application file for complete search history.

(56) References Cited

U.S. PATENT DOCUMENTS

| | | | |
|---|---|---|---|
| 5,661,485 A * | 8/1997 | Manuel ..................... 455/313 |
| 6,192,225 B1 * | 2/2001 | Arpaia et al. ............... 455/264 |
| 6,510,314 B1 * | 1/2003 | Kuo ........................ 455/326 |
| 6,687,494 B1 * | 2/2004 | Mourant ..................... 455/302 |
| 7,035,615 B2 * | 4/2006 | Kim et al. .................. 455/317 |
| 7,151,919 B2 * | 12/2006 | Takalo et al. ............... 455/323 |
| 7,174,136 B2 * | 2/2007 | Marshall et al. ............. 455/78 |
| 2005/0172718 A1 * | 8/2005 | Kalinin et al. ............... 73/579 |

FOREIGN PATENT DOCUMENTS

GB    2236225 A   *   3/1991
GB    2239143 A   *   6/1991

* cited by examiner

*Primary Examiner*—Lana Le
(74) *Attorney, Agent, or Firm*—Squire, Sanders & Dempsey, LLP

(57) ABSTRACT

A mixer arrangement includes a first mixer having at least one signal input for receiving a first signal the frequency of which is to be changed. The mixer arrangement also includes at least one frequency input for receiving an input frequency and at least one output. The first mixer is configured to mix a first signal with an input frequency to provide an output which is output by the at least one output. A second mixer has at least one frequency input for receiving an input frequency and at least one output. At least one output of the first mixer and at least one output of the second mixer are combined to cancel unwanted components from the input frequency in the outputs of the mixers.

27 Claims, 6 Drawing Sheets

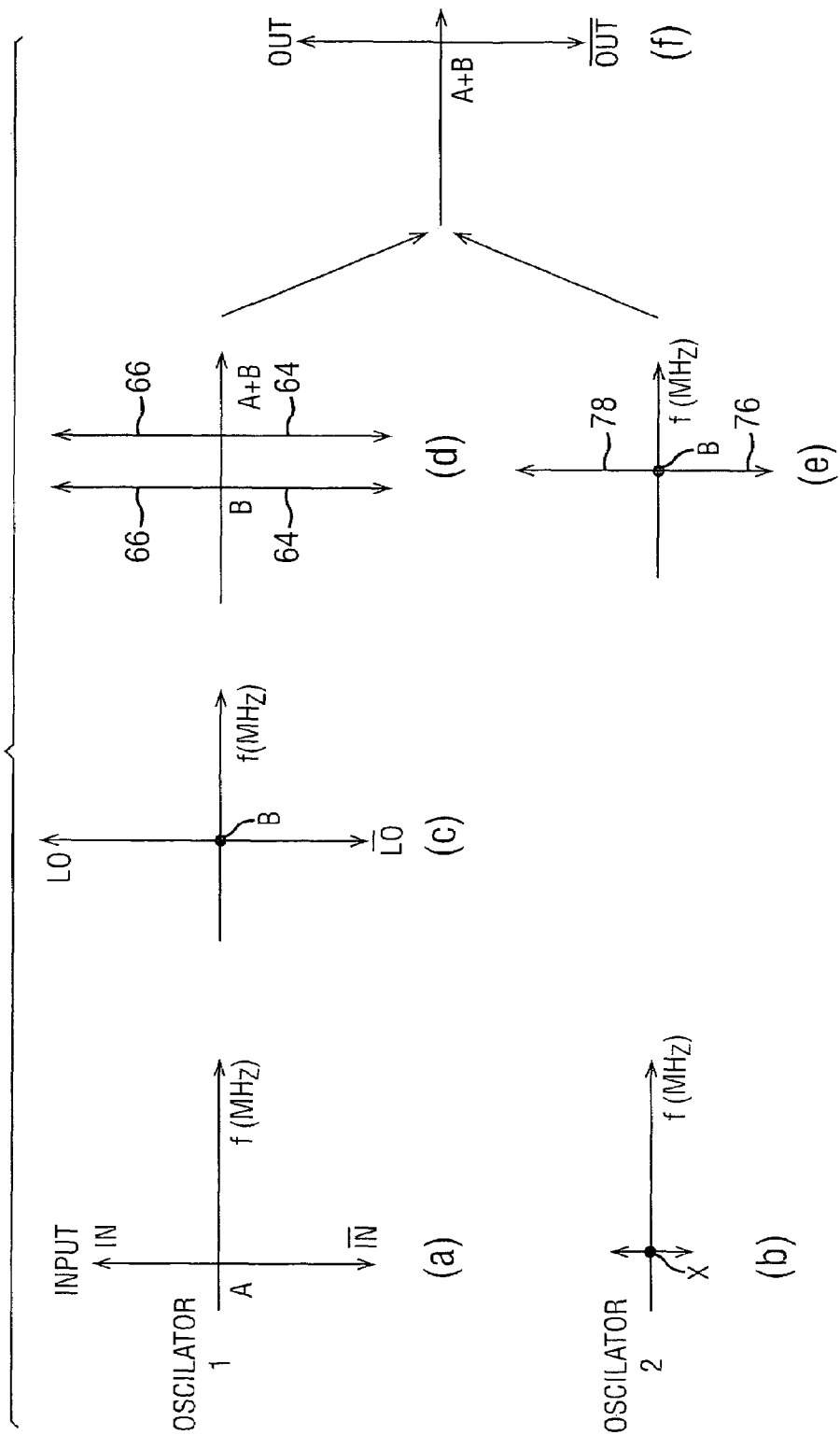

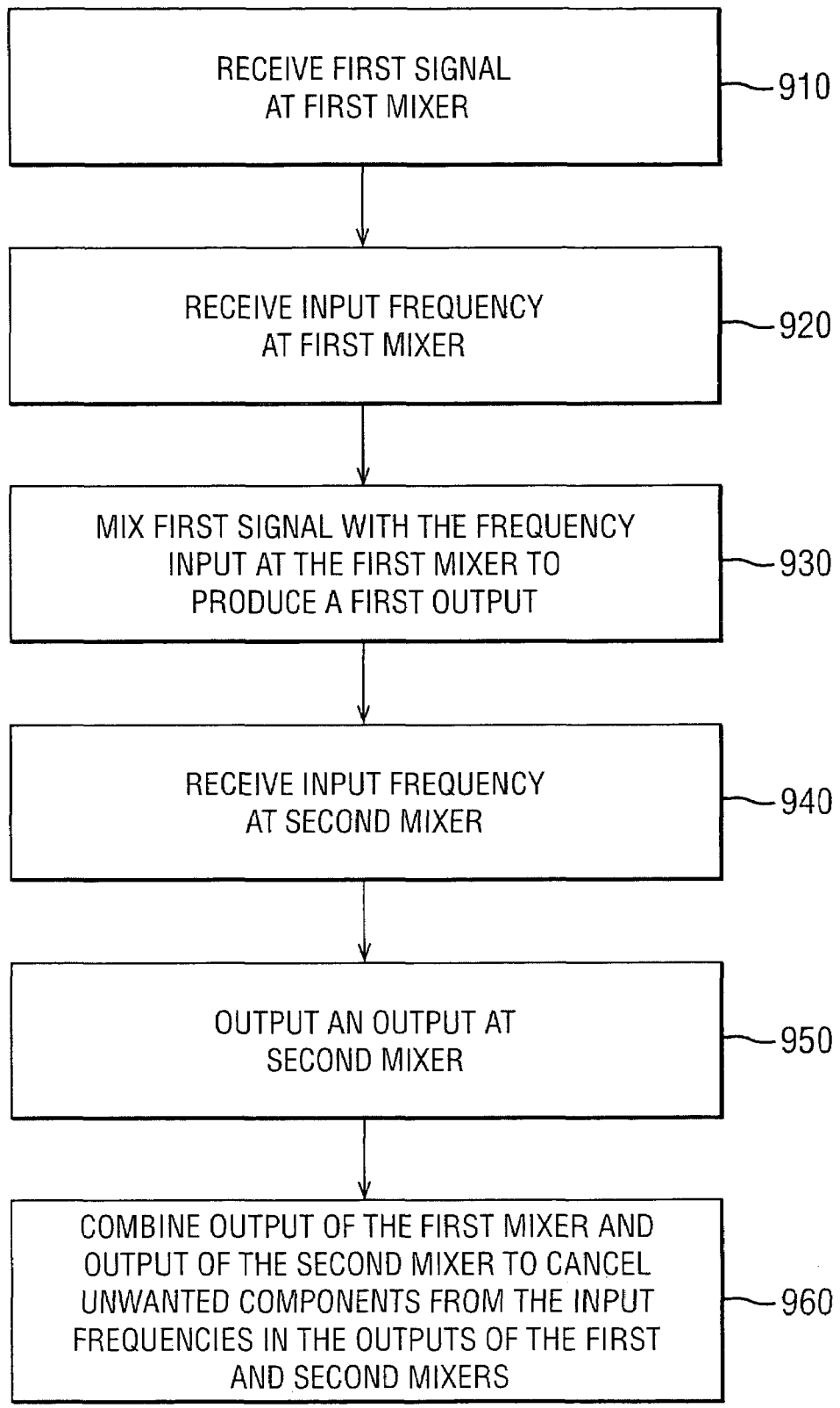

US 7,308,243 B2

MIXER ARRANGEMENT AND METHOD FOR MIXING SIGNALS

BACKGROUND OF THE INVENTION

1. Field of the Invention

The invention relates to a mixer arrangement and, in particular but not exclusively, to a mixer arrangement for use in a base station or mobile station or similar entity in a wireless telecommunications network.

2. Description of the Related Art

An area covered by a cellular telecommunications network is divided into a plurality of cells. Each of the cells has a base station arranged to transmit signals to and receive signals from mobile stations in the cell associated with the respective base station. Mobile stations will be in active communication with the base station associated with the cell in which the mobile station is located.

Both mobile stations and base stations take signals which are at a base band frequency and up convert them to a radio frequency for transmission. The base band frequency signals are either directly converted to the radio frequency or are converted via one or more intermediate frequencies. In order to up convert the base band frequency to the radio frequency directly or via the intermediate frequency or frequencies, a mixer is used. The mixer receives one input from the signal to be up converted and a second input which includes a frequency component. The second input to the mixer is generated by a local oscillator. The mixer mixes the two inputs and the resulting signal output by the mixer will have the signal information contained in the first input and will be at a frequency which is typically the sum of the input frequencies. For example, if a signal which is to be up converted has a frequency A (first input) and the signal with which it is to be mixed has a frequency B (second input), the mixer will output a frequency of A+B (or A−B in some implementations).

However, mixers which are used for this purpose have the problem that they allow the input signals to feed through the mixer. This means that the mixer will output the A+B frequency signals but also the signal at frequency A and the signal at frequency B. This can be a problem in that the frequency B is generally much greater than frequency A so that B is relatively close to the frequency A+B. Accordingly, in order to remove the unwanted B frequency, other devices have used complicated filtering solutions. For example, surface acoustic wave (SAW) filtering may be used which is both expensive and complicated to implement.

If the unwanted signal at frequency B is not filtered, this can lead to more harmful intermodulation products that can fall within the band of the wanted output. This produces loss of performance in the transmitter as the spectral purity is degraded. The unwanted local oscillator amplitude can drive some of the following power amplifier stages into compression which in turn produces more unwanted non linearity problems.

New standards are being proposed and implemented which involve using wide band multi carrier systems. It has been found that the problem of the unwanted frequency feeding through the mixer has a significant impact on such systems and can limit their performance.

SUMMARY OF THE INVENTION

The invention addresses one or more of the problems discussed above.

According to an embodiment of the invention, there is provided a mixer arrangement. The mixer arrangement includes a first mixer having at least one signal input for receiving a first signal the frequency of which is to be changed, at least one frequency input for receiving an input frequency and at least one output, the first mixer being configured to mix a first signal with an input frequency to provide an output which is output by the at least one output a second mixer having at least one frequency input for receiving an input frequency and at least one output, at least one output of the first mixer and at least one output of the second mixer being combined to cancel unwanted components from the input frequency in the outputs of the mixers.

BRIEF DESCRIPTION OF THE DRAWINGS

For a better understanding of the invention and as to how the same may be put into effect, reference will now be made by way of example only to the accompanying drawings in which:

FIG. 7 illustrates the signals with the arrangement of FIG. 6 and in particular:

FIG. 7a shows the signal inputs to the first mixer according to an embodiment of the invention;

FIG. 7b shows the inputs of the second mixer according to an embodiment of the invention;

FIG. 7c shows the oscillator inputs to the first and second mixers according to an embodiment of the invention;

FIG. 7d shows the outputs of the first mixer according to an embodiment of the invention;

FIG. 7e shows the outputs of the second mixer according to an embodiment of the invention;

FIG. 7f shows the output of the mixer arrangement according to an embodiment of the invention;

FIG. 9 illustrates an embodiment of the process of the invention.

DETAILED DESCRIPTION OF THE PREFERRED EMBODIMENTS

Figure 1:
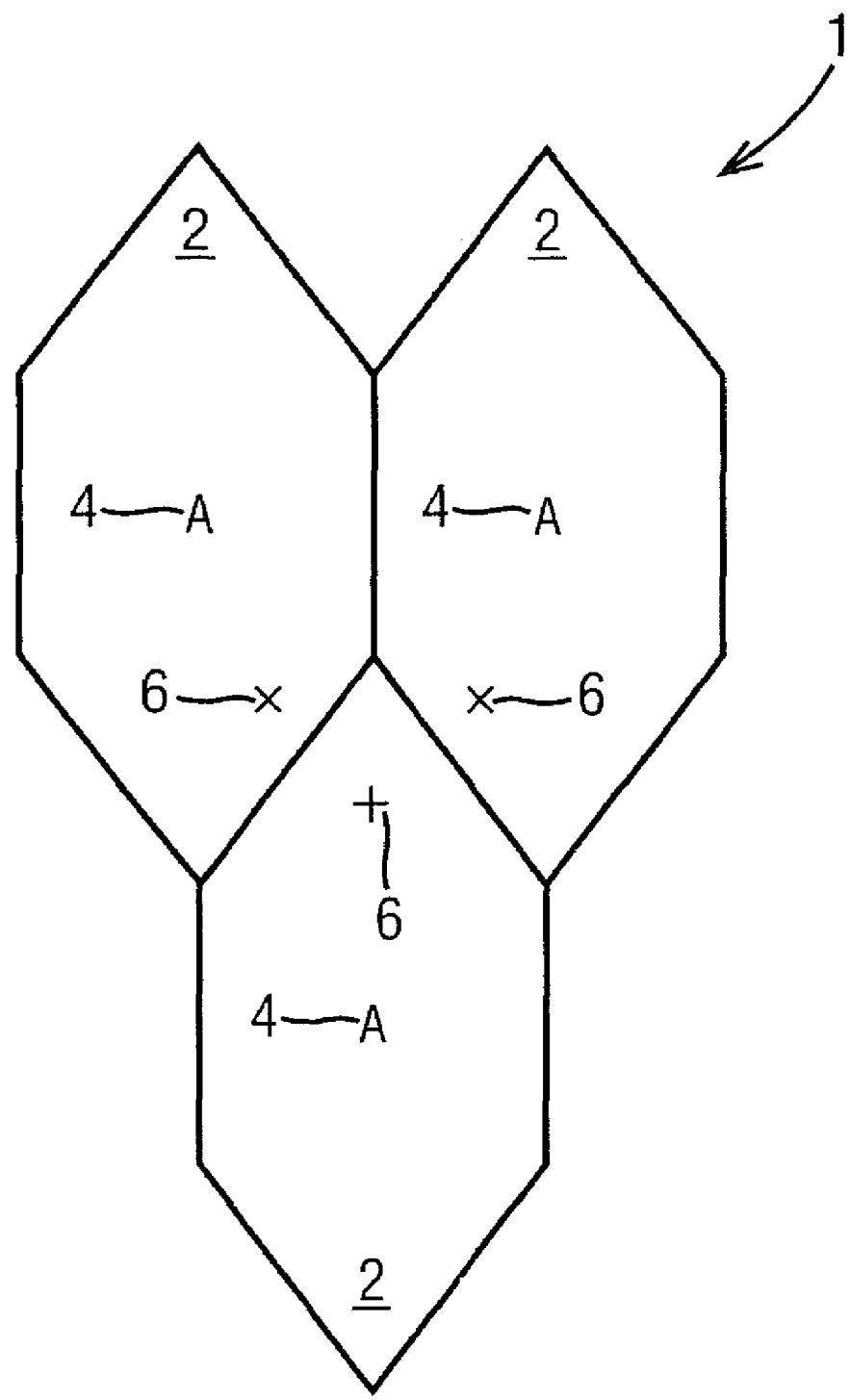
FIG. 1 shows schematically a cellular communications network in which embodiments of the invention can be used.

Reference is made to FIG. 1, which shows part of a cellular telecommunications network in which embodiments of the invention can be implemented. The area covered by the network 1 is divided into a plurality of cells 2, three of which are shown in FIG. 1. Typically, a network will have many more than three cells. Each cell 2 has associated therewith a base transceiver station 4. The base transceiver stations 4 are arranged to communicate with mobile terminals 6 or other user equipment, which may or may not be mobile, located in the cell associated with a given base station.

Figure 2:
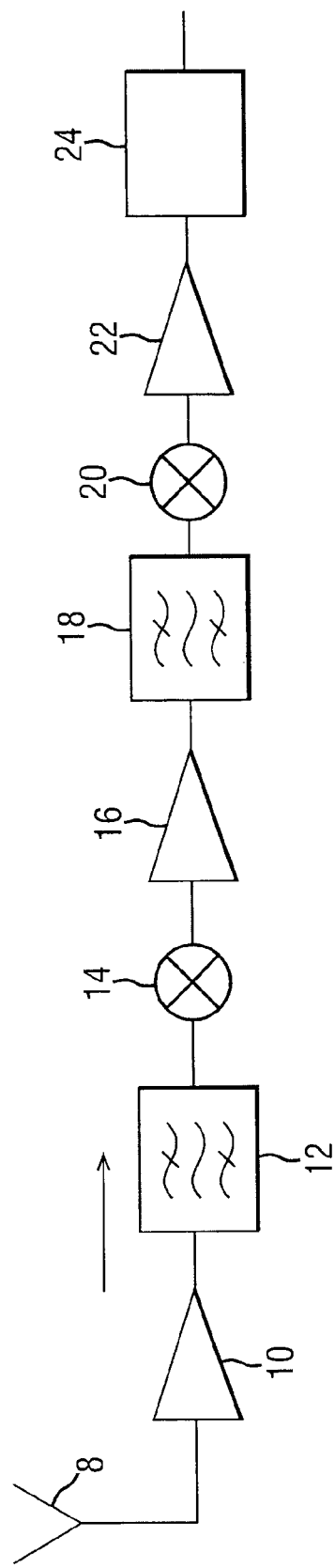
FIG. 2 shows a receiving arm of a base station or mobile station according to an embodiment of the invention.

Reference is made to FIG. 2, which schematically shows a receiving arm of the base station of FIG. 1. The base station has an antenna 8, which receives a signal transmitted from a mobile station. The received signal is amplified by a first amplifier 10, the output of which is connected to a first band pass filter 12 which removes frequency components outside a desired range. The output of the band pass filter is input to a mixer 14 which also receives an input from a local oscillator. This mixes the received signal with the output of the local oscillator to provide an output signal at an intermediate frequency. This output signal is input to an amplifier 16, the output of which is input to a band pass filter 18. Again, the band pass filter removes unwanted frequency components. The intermediate frequency signal is input to a second mixer 20 which mixers the intermediate frequency signal with an input from a local oscillator to provide an output at a base band frequency. The output of the mixer is input to an amplifier 22. The amplified output is input to an analog to digital converter 24, which converts the signal from the analog domain to the digital domain.

It should be appreciated that the arrangement shown in FIG. 2 is schematic. The output of the mixers may be input to band pass filters. Additionally, the amplifiers shown may not all be necessary and one or more of these amplifiers may be omitted. Furthermore, the position and/or number of the band pass filters in the transmit arm may be changed. FIG. 2 is intended to schematically show that a received signal is down converted first to an intermediate frequency and then to the base band frequency.

Figure 3:
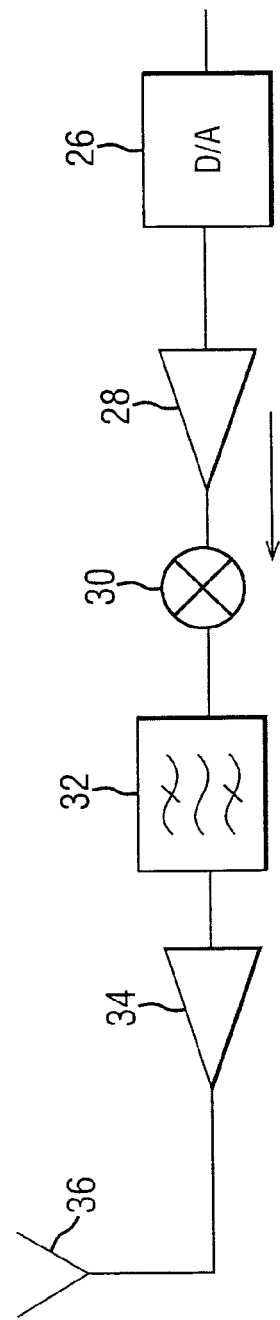
FIG. 3 shows the transmitting arm of a mobile station or base station according to an embodiment of the invention.

Reference is now made to FIG. 3 which schematically shows a transmit arm of the base station of FIG. 1. In FIG. 3, a base station frequency signal is directly up converted to a radio frequency. It should be appreciated that, alternatively, the base band frequency may be first up converted to an intermediate frequency. Likewise, it should be appreciated that in the receiving arm shown in FIG. 2, the radio frequency can be directly down converted to the base band frequency. It should be appreciated that in some embodiments of the invention, where an intermediate frequency is used, that there may be more than one intermediate frequency. For example, a base band frequency signal could be converted to a first intermediate frequency signal which in turn is converted to a second higher intermediate frequency signal which in turn is up converted to the radio frequency. These decisions are a matter of implementations.

The received signal is converted from a digital signal to an analog signal by a digital to analog converter 26. The output of the digital to analog converter is input to an amplifier 28 which amplifies the signal. The amplified signal is input to a mixer 30, which also receives an input from a local oscillator. The mixer 30 up converts the base band frequency to the radio frequency. The output of the mixer 30 is input to a band pass filter which removes unwanted frequency components. The output of the band pass filter is input to a power amplifier 34 which amplifies the signal. The signal is then transmitted by an antenna 36.

It should be appreciated that the number and/or position of band pass filters as well as amplifiers is again a matter of design choice. Accordingly, more or less than the two power amplifiers shown in FIG. 3 may be provided. The position of the power amplifiers in the transmit branch can also be changed. Likewise, the position and/or number of band pass filters can be altered in embodiments of the invention.

Figure 4:
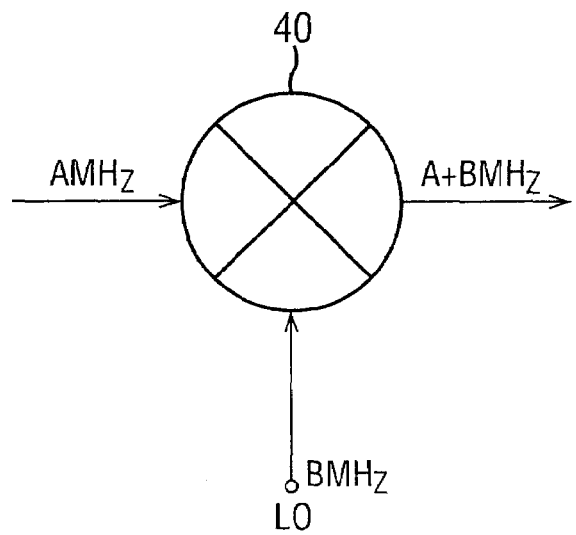
FIG. 4 shows schematically a known mixer arrangement according to an embodiment of the invention.

Reference is now made to FIG. 4 which shows a known oscillator 40 which has a first input AMHz which represent the signal to be up converted. The A MHz signal may be at an intermediate frequency or a base band frequency. The oscillator 40 also has a signal input from a local oscillator at BMHz. The mixer 40 is arranged to up convert the input signal of AMHz to provide an output signal at (A+B) MHz (or (B−A) MHz depending on the design). This output represents either the radio frequency or an intermediate frequency.

Figure 5A:
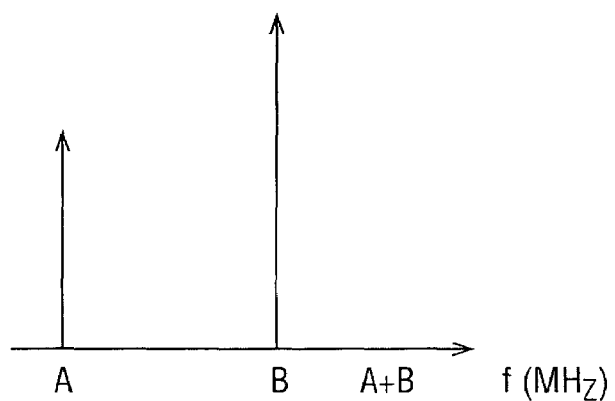
FIG. 5a shows the input to the mixer of FIG. 4 according to an embodiment of the invention.
Figure 5B:
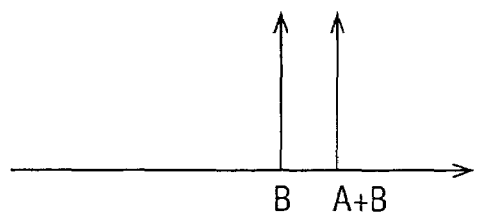
FIG. 5b shows the output of the mixer of FIG. 4 according to an embodiment of the invention.

Reference is made to FIG. 5a, which shows the inputs to the mixer. The input signal at the frequency of AMHz is typically much smaller than the input frequency at BMHz. Reference is made to FIG. 5b which shows the output of the mixer 40. As can be seen from the FIG. 5b, the output includes the desired component at the frequency (A+B) MHz and also an output component which is the caused by the input from the local oscillator and is at BMHz. This causes problems because frequency B is very much greater than frequency A, the frequency B MHz is relatively close to the frequency (A+B) MHz. This means that it is difficult to devise a simple filtering scheme to remove the BMHz frequency component but not the (A+B) MHz frequency component. Additionally, the input from the local oscillator tends to have a much larger amplitude than the input of the signal to be up converted. This means that the magnitude of the two components of the signals output by the local oscillator, that is the component at BMHz and the component at (A+B) MHz tend to be of a similar amplitude. Again, this means that the filtering not straight forward. The known solutions tend to be complicated and expensive to implement.

Figure 6:
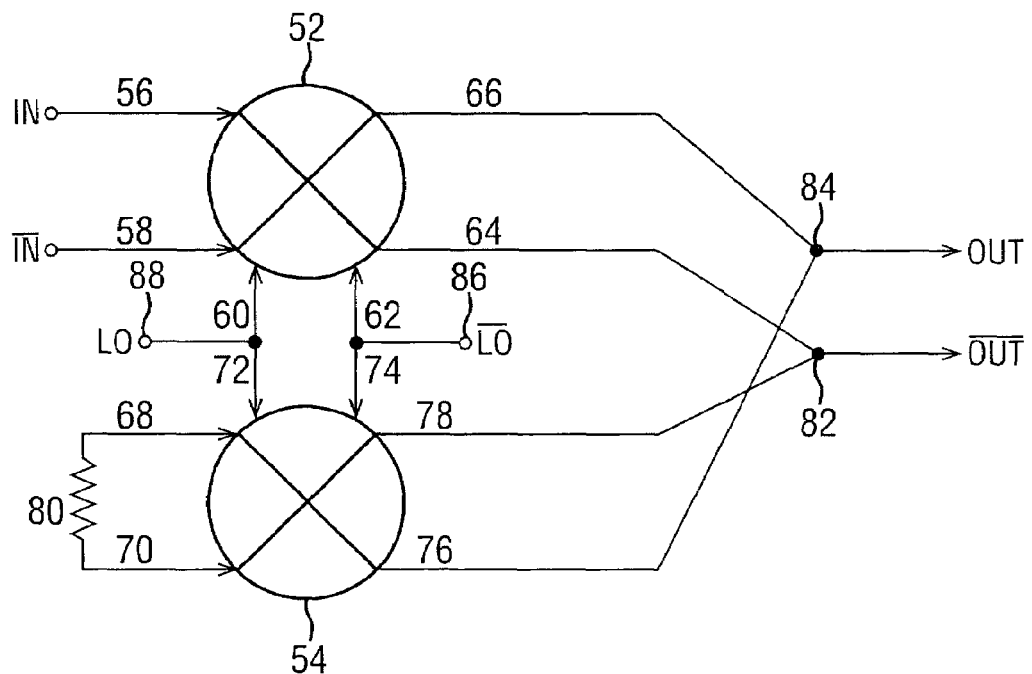
FIG. 6 shows a mixer arrangement embodying the invention.

Reference is now made to FIG. 6, which shows a first embodiment of the invention. The mixer arrangement embodying the invention includes a first mixer 52 and a second mixer 54. In this example, the first and second mixers are substantially the same. The first mixer 52 receives a first input 56 which is the signal to be up converted. The first mixer 52 receives a second input 58, which is the inverse of the signal which is to be up converted. The first mixer 52 has a third input 60 which receives the output 88 of a local oscillator. Finally, the first mixer 52 has a fourth input 62 which receives the inverted output 86 of the local oscillator.

The first mixer 52 has a first output 66 and a second output 64.

The second mixer 54 has a first input 68 and a second input 70. The first and second inputs 68 and 70 are connected to each other via a resistor 80 or other suitable resistive element. This resistor 80 has a resistance which is similar to the resistance on the first input 56 to the first mixer 52. It should be appreciated that the same resistance will in fact also be on the second input 58 the first mixer. In alternative embodiments of the invention, the inputs may be connected to ground. This may or may not be via a resistor.

The second mixer 54 has a third input 72 which receives the output 88 of the local oscillator. Finally, the fourth input 74 to the second mixer 54 is arranged to receive the inverted output 86 of the local oscillator. It should be appreciated that the local oscillator output 88 and the inverted local oscillator output 86 are input to both of the mixers.

The output of the second mixer is provided by outputs 76 and 78.

The first output 66 of the first mixer 52 is connected to the second output 76 of the second mixer 54 at a common node 84 which provides a single output signal. The second output 64 of the first mixer 52 is connected to a node 82 which is also connected to the first output 78 of the second mixer 54. The node 82 provides an output signal which is the inverse of the output signal provided by node 84.

Reference is now made to FIG. 7 which illustrates the signals of the embodiment of FIG. 6. FIG. 7a shows the signals received on the first and second inputs 56 and 58 of the first mixer 52. These input signals are a frequency of AMHz and are the signals to be up converted. One of these signals is simply the inverse of the other.

FIG. 7b shows the signals received on the inputs 68 and 70 of the second mixer. These are relatively small signals and can be regarded simply as noise. The representation shown in FIG. 7b is highly schematic. The signals in FIG. 7b should only be noise, but this will only be so if the resistance 80 is a 'good' match to the driving resistance from the signal generator on inputs 56 and 58. The drive impedance to inputs 56 and 58 may be a complex impedance (resistors, capacitors, inductors, etc), but it will be known. To get the circuit to perform so that the wanted output is not degraded, then resistor 80 needs to look like the same complex impedance.

FIG. 7c shows the local oscillator signal and its inverse, which are at frequency B. These local oscillator signals are input both to the first and to the second mixer.

The inputs to the first mixer 52 are at frequency A which is either an intermediate frequency or a base band frequency. The frequency provided by the local oscillator is a frequency such that when frequency B is mixed with frequency A, for example added or subtracted, the resulting signal will be at a higher intermediate or radio frequency depending on the design of the base station.

FIG. 7d shows the outputs of the first mixer. The first mixer provides the mixer output signal and its inverse. In other words, this provides the desired signal component which is (A+B) MHz and its inverse at the respective outputs. The outputs of the mixer also provide a component resulting from the local oscillator which is at BMHz and its inverse from the respective outputs. The frequency of the local oscillator i.e. BMHz is relatively close to that of the mixed output, i.e. (A+B) MHz. Both the desired component and local oscillator component are provided by one output and their respective inverses by the other output.

FIG. 7e shows the output of the second mixer 54. As can be seen, this just provides a component from the output of the local oscillator at BMHz and its inverse on the respective outputs. It should be appreciated that the component at XMHz is of virtually no magnitude so provides virtually no output or at least an output which can be easily ignored. In some embodiments of the invention, the mixer will produce both A−B and A+B. However as they are a long way apart in the frequency domain, so it is relatively easy to filter and keep the wanted frequency and remove the other. A+B is used for up-conversion and A−B is used for down conversion. For example if A=10 MHz and B=900 MHz, then A+B=910 MHz. In this example, A−B=10 MHz-900 MHz=890 MHz, which lands at 890 MHz but in the negative frequency domain. An image reject mixer can be used to remove the latter unwanted frequency. The B at 900 MHz is close to A+B at 910 MHz and embodiments of the invention address this case.

Consider an example of down conversion: A=910 MHz and B=900 MHz. The wanted frequency A−B=10 MHz and the unwanted frequency is A+B=1810 MHz. In a receiver according to this example where A−B, B, and A+B are far apart, the problem is not so great. The difficulty is that the unwanted frequency B can be very large in amplitude relative to the small wanted frequency at A−B and can cause difficulties such as saturating amplifier stage and causing distortion. Hence it is good to eliminate it at source, which can be performed by this invention.

The mixer will also down convert the image frequency at 890 MHz to the same frequency as A−B, i.e. Image A=890 MHz, B=900 MHz, and A−B=10 MHz. It lands on 10 MHz but with a phase shift, this can be removed by filtering the image at 890 MHz and then using image rejection mixers to further reduce this.

Embodiments of the invention can be embedded into an image rejection mixer. The image frequency is any unwanted signal at that frequency. It may be just low level noise, intermodulation distortion products from some other system, an alien blocker trying to jam your communications system and/or sidebands from the same transmitter, or the like.

By connecting the output of one of the mixers to the output of the other mixers, the local oscillator components can be cancelled. The first output 66 of the first mixer which provides an output with an unwanted frequency component B and a wanted frequency component A+B (both components are non inverted) is connected to the same node 84 as the output of the second mixer 54 which contains the unwanted component at frequency component from the inverted local oscillator signal. By connecting these two outputs together, the unwanted components from the local oscillator are removed to just provide the wanted component—that is the signal at frequency (A+B) MHz. Likewise, by connecting the second output 64 of the first mixer, which contains the unwanted component from the inverted output of the local oscillator and wanted component of the signal at frequency (A+B) MHz which is inverted to the output 78 of the second mixer, which provides the non inverted component from the oscillator, unwanted oscillator components are 180 degrees out of phase so when added together they simply cancel each other out. This just leaves the inverse of the desired component of the output, that is (A+B) MHz. This is shown in FIG. 7f.

It should be appreciated that in the embodiments of the invention, a single local oscillator provides all of the local oscillator signals for the mixers. In alternative embodiments of the invention, the local oscillator can be replaced by any other suitable frequency source.

Figure 8:
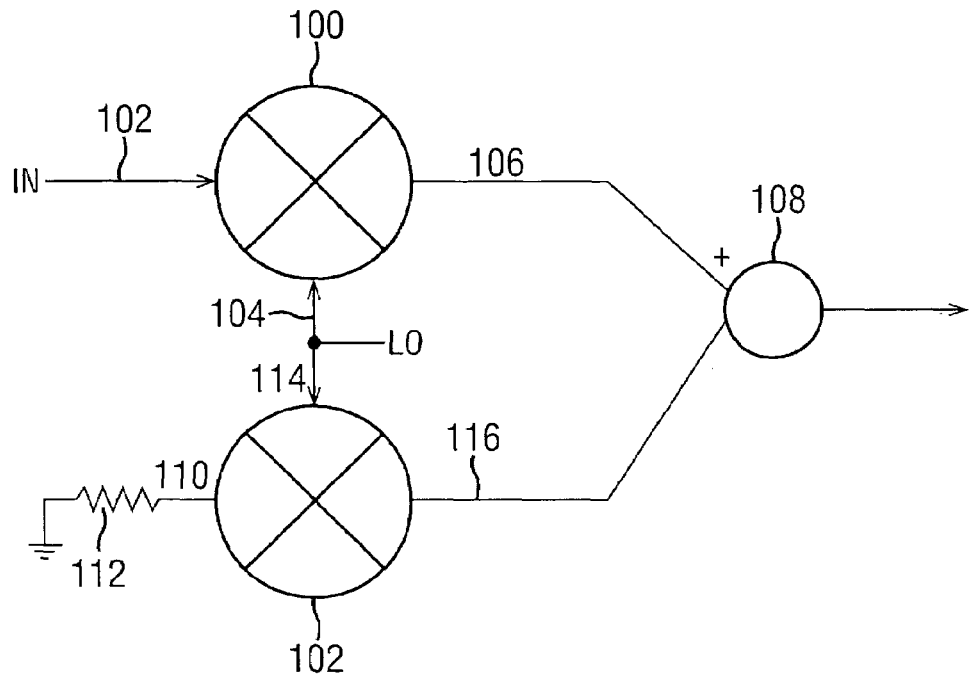
FIG. 8 shows a second mixer arrangement embodying the invention.

Reference is made to FIG. 8 which shows a second embodiment of the invention. As with the first embodiment of the invention, the mixing arrangement includes a first mixer 100 and a second mixer 102. However, the first mixer has a single input IN for the signal to be mixed and a single input 104 for the frequency signal from the local oscillator. The output of the first mixer 100 is input to a summing arrangement 108. The second mixer 102 has a first input 110 which is provided by a resistor 112 the other end of which is connected to ground. A second input 114 is provided for receiving the same frequency signal from the same local oscillator which supplies the first mixer. A single output 116 is provided. The output 116 of the second mixer is input to the summing arrangement 108 which sums the signals in such a way that the unwanted components of the outputs of the first and second mixers due to the oscillator are cancelled. Effectively, the output of the second mixer is inverted and added to the output of the first mixer or vice versa.

FIG. 9 illustrates the process of mixing signals in a mixer arrangement according to one embodiment of the invention. In step 910, the process receives a first signal at a first mixer, wherein the first signal includes a frequency to be changed. In step 920, the process receives a first input frequency input at the first mixer. In step 930, the process mixes the first signal with the frequency input to provide a first output from the first mixer. In step 940, the process receives a second input frequency at a second mixer. In step 950, the process outputs a second output from the second mixer. In step 960, the process combines the first output of the first mixer and the second output of the second mixer to cancel unwanted components from inputs of the first and second mixers of the mixer arrangement.

Embodiments of the invention have been described in the context of a base transceiver station. However, it should be appreciated that embodiments of the invention can also be used with a mobile station or indeed any other communications entity.

It should also be appreciated that embodiments of the invention have much wider application than to telecommunications and can be used in any situation where a signal needs to have its frequency changed.

The aforementioned embodiments of the invention have been described in the context of radio frequency signals. However it should be appreciated that embodiments of the invention can be used with a wide range of frequencies some of which can be lower than radio frequency signals and other of which may be higher.

Embodiments of the invention have been described in the context of the up conversion of a signal. It should be appreciated that embodiments of the invention can also be used where down conversion of a signal is required.

It should be appreciated that embodiments of the invention make direct conversion that is where a signal is converted from base band frequency to the radio frequency directly without going via an intermediate frequency.

Embodiments of the invention are particularly suited to integrated circuit integrated technologies. Accordingly, the embodiments of the invention are implemented on an integrated circuit. However, it should be appreciated that embodiments of the invention may be also implemented with discreet components.

Embodiments of the invention have the advantage that implementation is simple. Embodiments of the invention may eliminate the need for complex filtering. Additionally wide band multi carrier systems can be more readily achieved if embodiments of the invention are used.

Because embodiments of the invention use two signal paths which are well matched, particularly if embodiments of the invention are implemented in integrated circuitry, the need for complex gain and phase adjustment circuitry can be removed. Although two mixers are required, generally mixers require relatively small amounts of silicon area and indeed the amount occupied by the additional mixer is probably considerably less than the more complicated filtering that would be required. Additionally, it is much easier simply to have two duplicate mixers than to provide the complex additional filtering circuitry that would otherwise be required. Furthermore, the mixers are passive circuit elements and have very little power consumption and all thus much more efficient than more power hungry circuitry that might otherwise be required if embodiments of the invention were not used. Because embodiments of the invention allow up conversion to be done in one step or two steps relatively easy, the more complicated up conversion schemes of conventional mixer arrangements involving two or even more steps can be avoided.

The invention claimed is:

1. A mixer arrangement comprising:
a first mixer having first signal input configured to receive a first signal including a frequency of which is to be changed, a second signal input configured to receive a second signal including an inverse of the first signal, first frequency input configured to receive an input frequency, a second frequency input configured to receive an inverse of the input frequency, a first output, and a second output, said first mixer being configured to mix the first signal with the first input frequency to provide an output which is output by said first output and said first mixer being configured to mix the second signal with the second input frequency to provide an output which is output by said second output; and
a second mixer having at least one frequency input configured to receive the input frequency and having at least one output,
wherein the first output of the first mixer and at least one output of said second mixer being combined to cancel unwanted components in the outputs of said mixers, and
wherein said unwanted components comprise said input frequency.

2. A mixer arrangement as claimed in claim 1, wherein said first mixer comprises a single signal input, a single frequency input and a single output and wherein said second mixer comprises a single frequency input and a single output.

3. A mixer arrangement as claimed in claim 2, further comprising a combiner configured to combine the single output of said first mixer and the single output of the second mixer.

4. A mixer arrangement as claimed in claim 1, wherein said first mixer is configured to provide a first output and a second output and said second mixer is configured to provide a third output and a fourth output.

5. A mixer arrangement as claimed in claim 4, wherein the mixer arrangement is such that the first output of the first mixer is an inverse of the second output of the first mixer and the third output of the second mixer is an inverse of the fourth output of said second mixer.

6. A mixer arrangement as claimed in claim 4, wherein the first output of the first mixer is connected to the first output of the second mixer and one other output of the first mixer is connected to the second output of the second mixer.

7. A mixer arrangement as claimed in claim 1, wherein said first mixer includes a first signal input and a second signal input, said arrangement being such that the first signal input is an inverse of the second signal input.

8. A mixer arrangement as claimed in claim 1, wherein said second mixer has two inputs, said two inputs being connected.

9. A mixer arrangement as claimed in claim 8, wherein a resistive element is provided between said two inputs of said second mixer.

10. A mixer arrangement as claimed in claim 9, wherein the resistive element of the second mixer has a resistance substantially equal to a resistance on at least one signal input of said first mixer.

11. A mixer arrangement as claimed in claim 1, wherein said second mixer has two inputs, at least one input of said two inputs is connected to ground.

12. A mixer arrangement as claimed in claim 1, wherein said first mixer having two frequency signal inputs and said second mixer having two frequency signal inputs.

13. A mixer arrangement as claimed in claim 12, wherein one frequency input to each of said first and second mixers is configured to receive an inverse frequency signal which is an inverse of a frequency signal which another frequency signal input of each of the first and second mixers is arranged to receive.

14. A mixer arrangement as claimed in claim 1, wherein said at least one output of the first mixer comprises a first signal component resulting from mixing an input signal with a frequency and a second signal component resulting from a frequency signal, said second signal component being an unwanted component.

15. A mixer arrangement as claimed in claim 14, wherein said at least one output of the second mixer comprises a signal component resulting from the frequency signal, said signal component being an unwanted component.

16. A mixer arrangement as claimed in claim 14, wherein the at least one output of the first mixer is combined with the at least one output of the second mixer so that the signal component of the output of the second mixer cancels the second signal component of the output of the first mixer.

17. A mixer arrangement as claimed in claim 1, wherein said first mixer is configured to upconvert the frequency of the first signal received at the at least one signal input.

18. A mixer as claimed in claim 17, wherein the first signal is upconverted to a radio frequency.

19. A mixer arrangement as claimed in claim 1, wherein said first and second mixers having similar configurations.

20. A mixer arrangement as claimed in claim 1, wherein said at least one frequency input of said first and second mixers are arranged to receive a frequency from a common frequency source.

21. A mixer as claimed in claim 20, wherein said common frequency source includes a local oscillator.

22. A mixer arrangement as claimed in claim 1, wherein the mixer arrangement is incorporated in an integrated circuit.

23. A mixer arrangement as claimed in claim 1, wherein the mixer arrangement is incorporated in a wireless telecommunications entity.

24. A mixer arrangement as claimed in claim 23, wherein said wireless telecommunications entity is one of a base station and a mobile station.

25. A mixer arrangement as claimed in claim 1, wherein the mixer arrangement is incorporated in an image rejection mixer.

26. A method, the comprising:
receiving a first signal at a first mixer, wherein the first signal includes a frequency to be changed;
receiving a second signal at said first mixer, wherein the second signal includes an inverse of the first signal;
receiving an input frequency input at said first mixer;
receiving an inverse of the frequency input at said first mixer;
mixing the first signal with the frequency input to provide a first output from said first mixer;
mixing the second signal with the inverse of the frequency input to provide a second output from said first mixer;
receiving the input frequency at a second mixer;
outputting a second output from said second mixer; and
combining the first output of the first mixer and the second output of said second mixer to cancel unwanted components in the outputs of said mixers,
wherein said unwanted components comprise said input frequency.

27. A mixer arrangement, comprising:
first receiving means for receiving a first signal at a first mixer, wherein the first signal includes a frequency to be changed;
second receiving means for receiving an input frequency input at said first mixer;
third receiving means for receiving a second signal at said first mixer, wherein the second signal includes an inverse of the first signal;
fourth receiving means for receiving an inverse of the frequency input at said first mixer;
mixing means for mixing the first signal with the frequency input to provide a first output from said first mixer and for mixing the second signal with the inverse of the frequency input to provide a second output from said first mixer;
fifth receiving means for receiving the input frequency at a second mixer;
outputting means for outputting a second output from said second mixer; and
combining means for combining the first output of the first mixer and the second output of said second mixer to cancel unwanted components in the outputs of said mixers,
wherein said unwanted components comprise said input frequency.

* * * * *